(12) United States Patent
Zhang et al.

(10) Patent No.: US 7,858,482 B2
(45) Date of Patent: Dec. 28, 2010

(54) METHOD OF FORMING A SEMICONDUCTOR DEVICE USING STRESS MEMORIZATION

(75) Inventors: Da Zhang, Hopewell Junction, NY (US); Christopher C. Hobbs, Poughkeepsie, NY (US); Srikanth B. Samavedam, Fishkill, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 213 days.

(21) Appl. No.: 12/059,286

(22) Filed: Mar. 31, 2008

(65) Prior Publication Data
US 2009/0242944 A1 Oct. 1, 2009

(51) Int. Cl.
*H01L 21/336* (2006.01)
(52) U.S. Cl. ............... 438/306; 438/216; 438/305; 438/199; 438/E21.632
(58) Field of Classification Search ......... 438/197–199, 438/216, 229–238, 279, 301–308, 365
See application file for complete search history.

(56) References Cited

U.S. PATENT DOCUMENTS 7,144,767 B2 12/2006 Chidambarrao et al.
7,569,499 B2 * 8/2009 Chidambaram ............. 438/781
2005/0082634 A1 4/2005 Doris et al.
2008/0076215 A1 * 3/2008 Chuang et al. .............. 438/199
2009/0032877 A1 * 2/2009 Visokay et al. .............. 257/368
2009/0065880 A1 * 3/2009 Jain et al. .................... 257/412
2009/0221117 A1 * 9/2009 Tan et al. .................... 438/238
2009/0286365 A1 * 11/2009 Teo et al. .................... 438/197

OTHER PUBLICATIONS

Eiho et al; "Management of Power and Performance with Stress memorization Technique for 45nm CMOS" 2007 Symposium on VLSI Technology Digest of Technical Papers, pp. 218-219.
PCT Search Report and Written Opinion, PCT/US2009/033187, Mailed Sep. 11, 2009.

* cited by examiner

*Primary Examiner*—Dung A. Le
(74) *Attorney, Agent, or Firm*—James L. Clingan, Jr.; Michael J. Balconi-Lamica (57) ABSTRACT

A stress memorization technique (SMT) film is deposited over a semiconductor device. The SMT film is annealed with a low thermal budget anneal that is sufficient to create and transfer the stress of the SMT film to the semiconductor device. The SMT film is then removed. After the SMT film is removed, a second anneal is applied to the semiconductor device sufficiently long and at a sufficiently high temperature to activate dopants implanted for forming device source/drains. The result of this approach is that there is minimal gate dielectric growth in the channel along the border of the channel.

15 Claims, 7 Drawing Sheets

METHOD OF FORMING A SEMICONDUCTOR DEVICE USING STRESS MEMORIZATION

BACKGROUND

1. Field

This disclosure relates generally to making semiconductors, and more specifically, to making semiconductor devices using a stress memorization.

2. Related Art

A stress memorization technique (SMT) that includes forming a SMT film over a transistor has been found in which stress can be created and transferred to an underlying transistor channel by a thermal treatment, and the stress can be retained by the underlying transistor even after the SMT film has been removed. The removal of the SMT film after the stress transfer is for exposing transistor source/drain/gate regions for contact silicidation. It is well known in the art that proper channel stress can enhancement transistor carrier mobility. For example, N-type transistor is enhanced by tensile stress which can be induced by SMT. Although there are benefits, one problem that has been found in using SMT films is that the gate dielectric tends to grow in the channel along the border of the channel during the SMT processes. This adversely impacts transistor performance.

Thus there is a need for a technique that induces stress to transistor devices with the SMT but avoiding or reducing the problem described above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A stress memorization technique (SMT) film is deposited over a semiconductor device. The SMT film is annealed with a low thermal budget anneal that is sufficient to create and transfer the stress of the SMT film to the semiconductor device. The SMT film is then removed. After the SMT film is removed, a second anneal is applied to the semiconductor device sufficiently long and at a sufficiently high temperature to activate dopants implanted for forming device source/drains. The result of this approach is that there is minimal gate dielectric growth in the channel along the border of the channel. This is better understood by reference to the drawings and the following description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
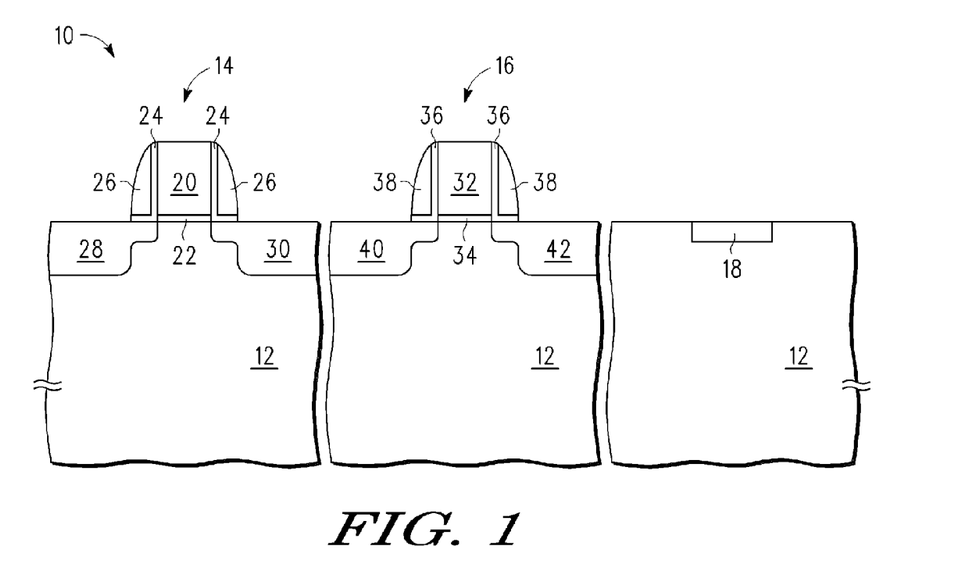
FIG. 1 is a cross section of a semiconductor device at a stage in processing according to a first embodiment.

Shown in FIG. 1 is a semiconductor device 10 comprising a semiconductor substrate 12, an N channel device 14 in and over substrate 12, a P channel device 16 in and over substrate 12, and a resistor 18 in substrate 12. N channel device 14 comprises a gate 20, an oxide liner 24 around gate 20 and extending outward from gate 20 on substrate 12, a sidewall spacer 26 around gate 20 and over liner 24, an implanted source/drain region 28 on one side of gate 20 that is in substrate 12 and aligned to one side of gate 20, and an implanted source/drain region 30 on an opposing side of gate 20 that is in substrate 12 and aligned to an opposing side of gate 20. P channel device 16 comprises a gate 32, an oxide liner 36 around gate 32 and extending outward from gate 32 on substrate 12, a sidewall spacer 38 around gate 32 and over liner 36, an implanted source/drain region 40 on one side of gate 32 that is in substrate 12 and aligned to one side of gate 32, and an implanted source/drain region 42 on an opposing side of gate 32 that is in substrate 12 and aligned to an opposing side of gate 32. Gates 20 and 32 are preferably gate stacks comprised of one or more layers of metal and having a top layer of semiconductor material such as polysilicon or amorphous silicon. In the case of gate 20, the metal layer in contact with gate dielectric 22 is preferably chosen to be a metal favorable for N channel transistors. Similarly for gate 32, the metal layer in contact with gate dielectric 34 is preferably chosen to be a metal favorable for P channel transistors. There may be situations in which it is desirable for the metal layer for the N and P transistors to be the same. Gate dielectrics 22 and 34 may comprise a high K dielectric. Metal oxides, hafnium oxide is such an oxide, are known to be effective for use as high K dielectrics in forming gate dielectrics. Liners 24 and 36 may be deposited oxide. Sidewall spacers 26 and 38 may be deposited nitride. Also liners 24 and 36 and sidewall spacers 26 and 38 may be formed in multiple layers and potentially of other materials. Source/drain regions 28, 30, 40, and 42 are formed by implants using gates 20 and 32 and sidewall spacers 26 and 38 as masks. The source/drain may or may not comprise an embedded source/drain stressor, which is formed by recessing source/drain followed by epitaxial growth of a strained semiconductor material in the recessed region. Resistor 18 may be formed by an implant into substrate 12. An alternative is to use a portion of the gate stack materials or the entire stack of gate stack materials.

Figure 2:
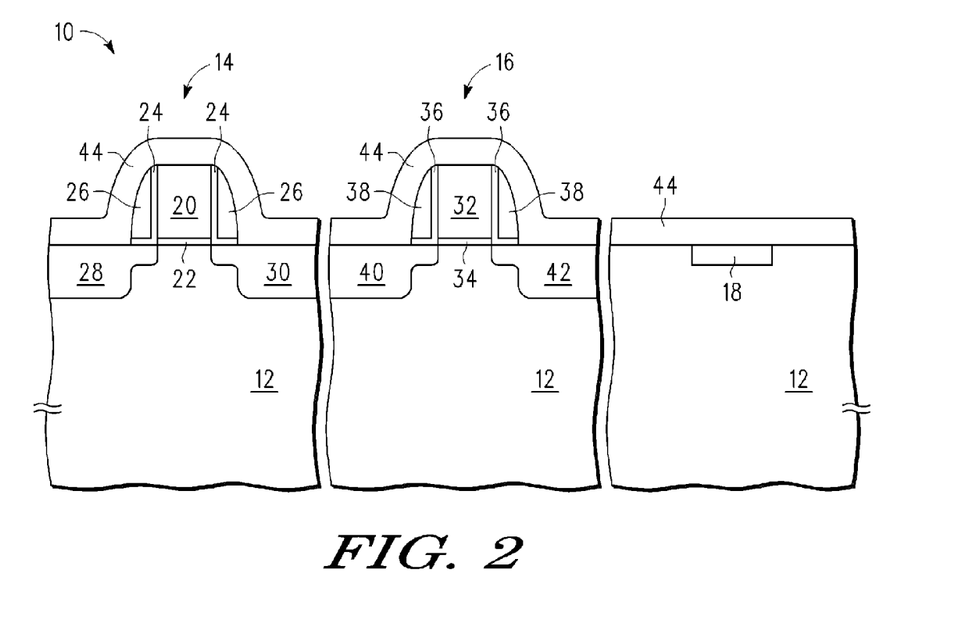
FIG. 2 is a cross section of the semiconductor device of FIG. 1 at subsequent stage in processing.

Shown in FIG. 2 is semiconductor device 10 after depositing an SMT film 44 over devices 14 and 16 and resistor 18. SMT film 44 may include nitride that is deposited by plasma enhanced chemical vapor deposition (PECVD). SMT film 44 preferably includes a relatively thin oxide layer deposited before the nitride layer. An example may be that the nitride layer is about 500 Angstroms thick and the oxide layer may then be about 100 Angstroms thick.

Figure 3:
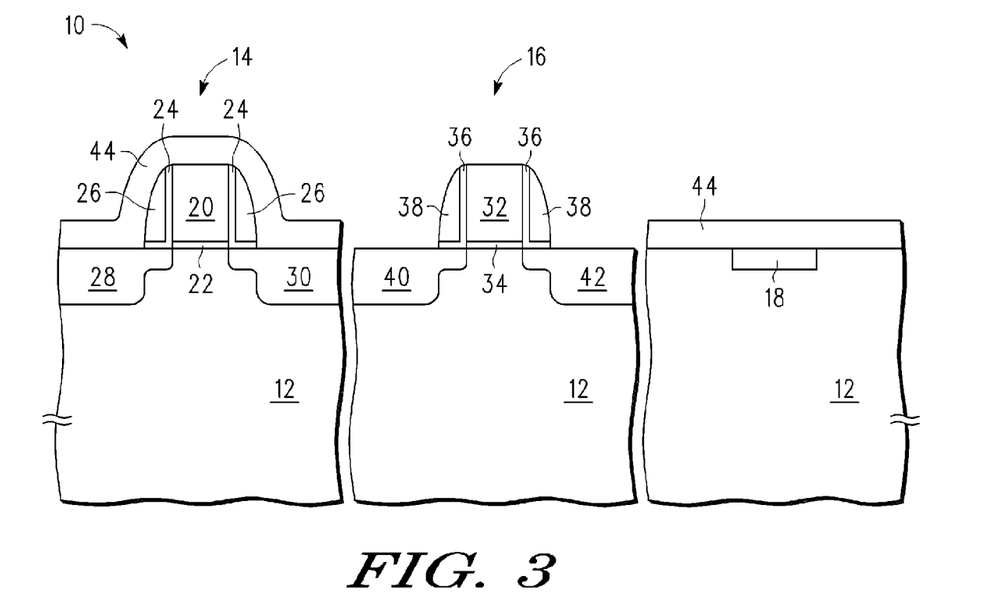
FIG. 3 is a cross section of the semiconductor device of FIG. 2 at subsequent stage in processing.

Shown in FIG. 3 is semiconductor device 10 after removing SMT film 44 from over P channel device 16. This may be done by conventional photoresist patterning and subsequent etching.

Figure 4:
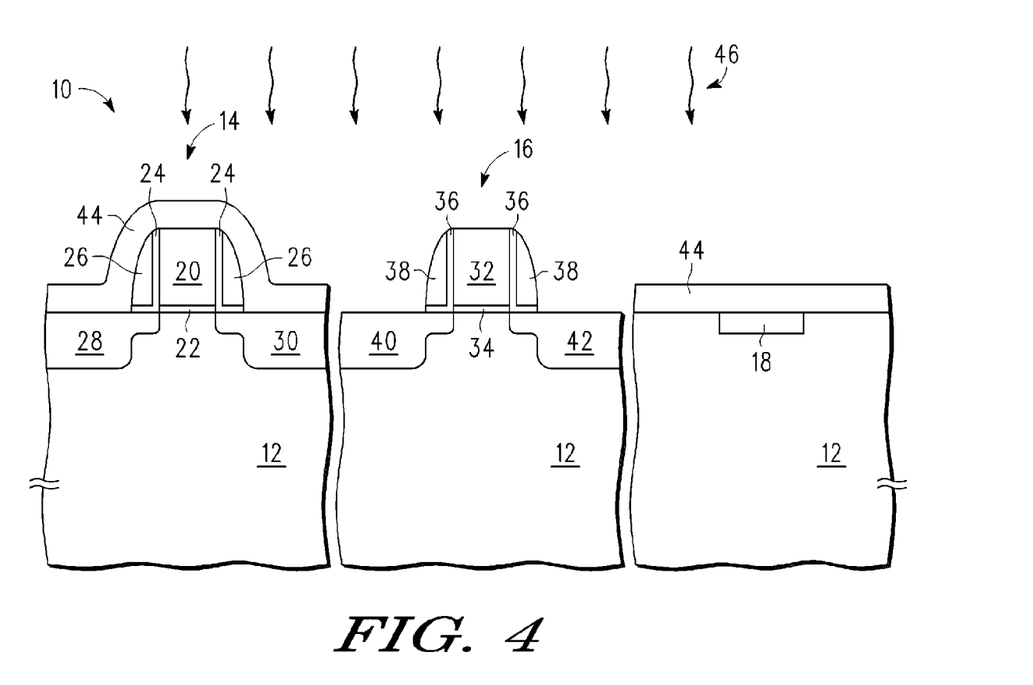
FIG. 4 is a cross section of the semiconductor device of FIG. 3 at subsequent stage in processing.

Shown in FIG. 4 is semiconductor device 10 receiving an anneal 46. Anneal 46 causes tensile stress in the channel of N channel device through the tensile stress of SMT film 44 in a manner that causes N channel device 14 to retain the stress, or at least much of it, that that was caused during anneal 46. This stress transfer by anneal 46 can be achieved with heat applied by a laser for a duration that is very short compared to conventional anneals. A laser anneal can be about a millisecond. Anneal 46 is preferably about 1250 degrees Celsius for about 1 millisecond and preferably less than 10 milliseconds. This is sufficient to provide the stress transfer but not too much to cause gate dielectric growth in the channel. It also, however, is not sufficient to activate the implants of source/drains 28, 30, 40, and 42. Thus, after anneal 46, the needed stress transfer has occurred with minimal additional oxide growth in the channel, but the source/drain dopants have not been activated.

Figure 5:
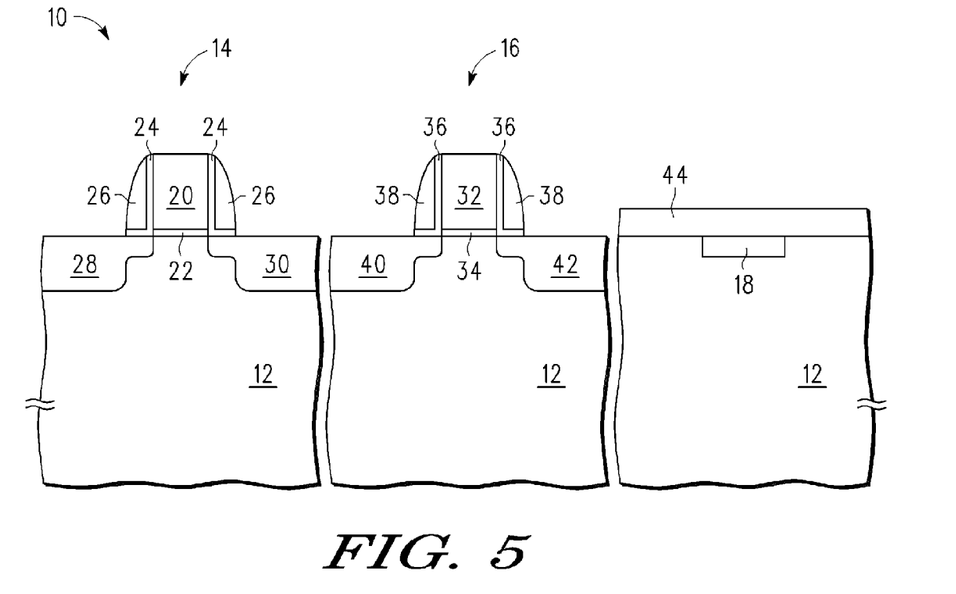
FIG. 5 is a cross section of the semiconductor device of FIG. 4 at subsequent stage in processing.

Shown in FIG. 5 is semiconductor device 10 after SMT film has been removed from over N channel device 14. This includes a masking step because SMT film 44 is preferably retained over resistor 18 to provide mask to a subsequent silicide step.

Figure 6:
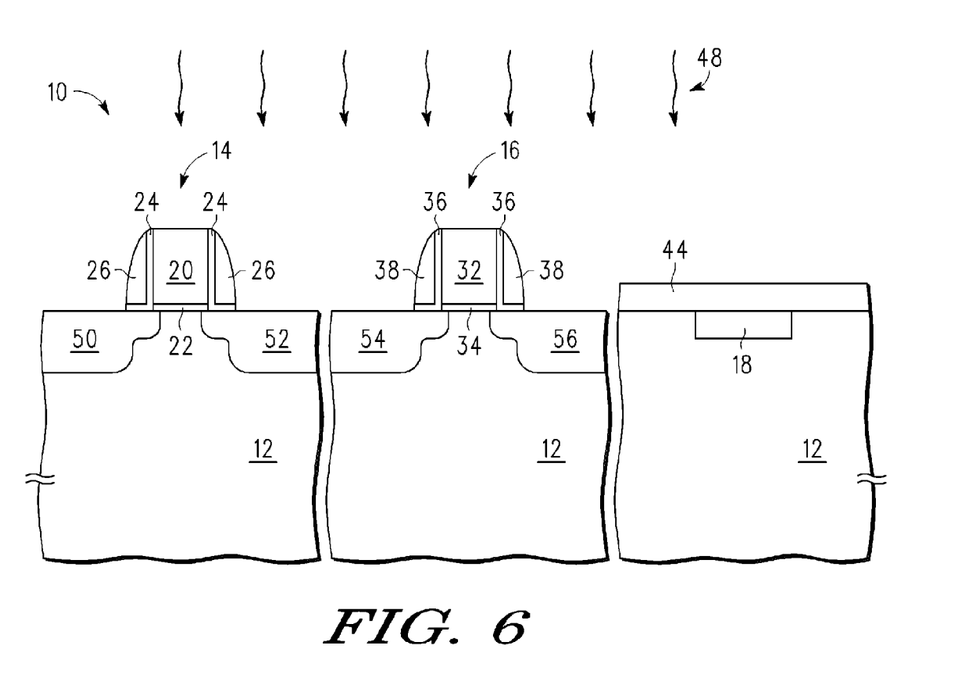
FIG. 6 is a cross section of the semiconductor device of FIG. 5 at subsequent stage in processing.

Shown in FIG. 6 is semiconductor device 10 after performing an anneal 48 that activates the dopants in implanted source/drain regions 28, 30, 40, and 42 to resulting in activated source/drain regions, 50, 52, 54, and 56, respectively. Anneal 48 can be achieved using a conventional rapid thermal anneal (RTA) type anneal. One example of such an RTA anneal is a spike anneal that includes ramping up the temperature then ramping it down. Anneal 48 has been found to be effective when the anneal chamber temperature is ramped up from room temperature to 1065 degrees Celsius at a rate of 200 degrees Celsius per second and upon attaining 1065 degrees Celsius immediately ramping down to room temperature at a rate of 75 degrees per second. Activating the source/drain implants causes some diffusion of the implanted dopants so that activated source/drain regions 50, 52, 54, and 56 are somewhat larger than their counterpart implanted source/drain regions 28, 30, 40, and 42, respectively.

Figure 7:
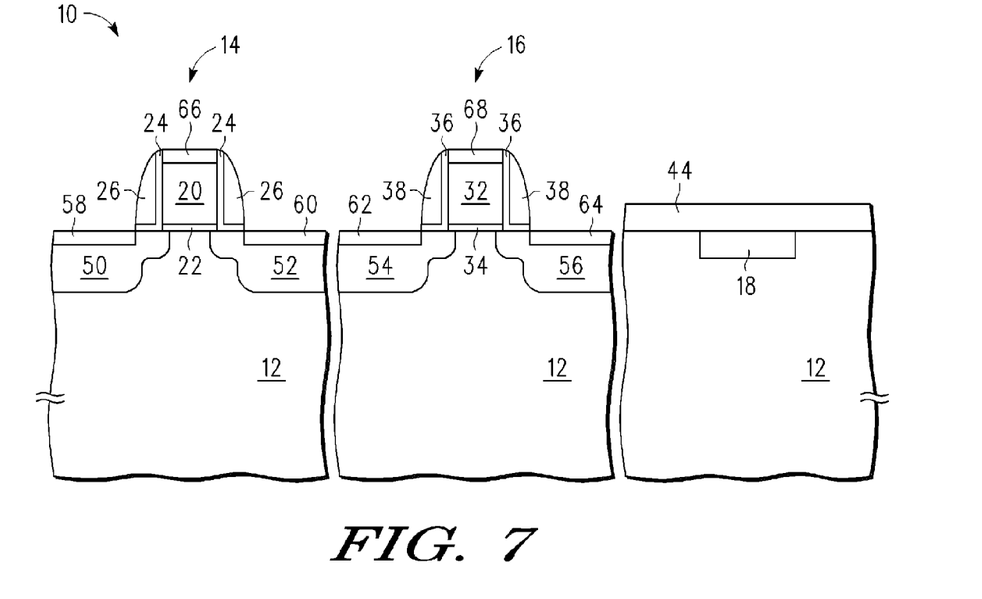
FIG. 7 is a cross section of the semiconductor device of FIG. 6 at subsequent stage in processing.

Shown in FIG. 7 is semiconductor device 10 after forming a silicide region 58 in a top portion of source/drain region 50, a silicide region 60 in a top portion of source/drain region 52, a silicide region 62 in a top portion of source/drain region 54, and a silicide region 64 in a top portion of source/drain region 56. Recalling that gates 20 and 32 are preferably gate stacks that have semiconductor top layers, a silicide region 66 is formed in a top portion of source/drain region 50 in a top portion of source/drain region 50, and a silicide region 68 is formed in a top portion of source/drain region 50. During the silicidation, resistor 18 is protected by SMT film 44 that was not etched way when SMT film was etched away from either of devices 14 or 16.

Semiconductor device 10 of FIG. 7 thus includes an N channel device with a channel that has performance enhancing tensile stress having no or minimal additional oxide growth in the channel while P channel transistor 16 is unaffected and resistor 18 is protected. Thus gate dielectric degradation is ameliorated while desired tensile stress is beneficially applied to the channel of the N channel transistor. The reason for this process resulting in reduced gate dielectric growth is believed to be related to allowing oxygen atoms that become free in the liner during the more extended annealing being allowed to escape. If the SMT film is present, it is theorized that the free oxygen atoms are blocked by the SMT covering the liner and causing the trapped oxygen atoms to react with the underlying substrate. This reaction can extend to the area under the gate dielectric thus causing an increase in thickness in the gate dielectric, which hurts electrical performance. The oxygen atoms have a preference for escaping so that if the escape route is available they will do that rather than react with the substrate. The short laser anneal results in few free oxygen atoms. The escape route is available during the longer activation anneal.

Figure 8:
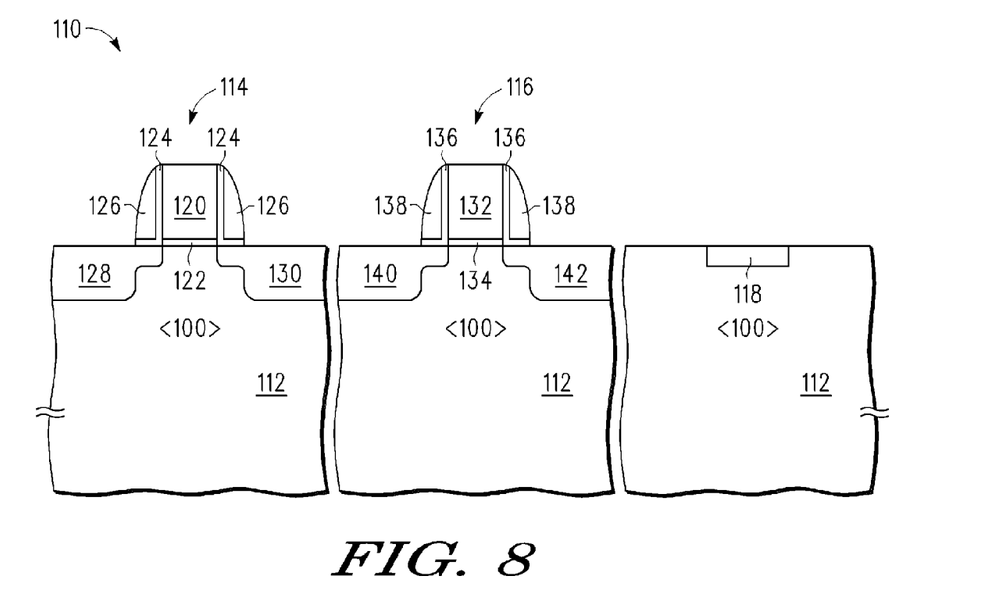
FIG. 8 is a cross section of a semiconductor device at a stage in processing according to a second embodiment.

Shown in FIG. 8 is a semiconductor device 110 comprising a semiconductor substrate 112, an N channel device 114 in and over substrate 112, a P channel device 116 in and over substrate 112, and a resistor 118 in substrate 112. N channel device 114 comprises a gate 120, an oxide liner 124 around gate 120 and extending outward from gate 120 on substrate 112, a sidewall spacer 126 around gate 120 and over liner 124, an implanted source/drain region 128 on one side of gate 120 that is in substrate 112 and aligned to one side of gate 120, and an implanted source/drain region 130 on an opposing side of gate 120 that is in substrate 112 and aligned to an opposing side of gate 120. P channel device 16 comprises a gate 132, an oxide liner 136 around gate 132 and extending outward from gate 132 on substrate 112, a sidewall spacer 138 around gate 132 and over liner 136, an implanted source/drain region 140 on one side of gate 132 that is in substrate 112 and aligned to one side of gate 132, and an implanted source/drain region 142 on an opposing side of gate 132 that is in substrate 112 and aligned to an opposing side of gate 132. Gates 120 and 132 are preferably gate stacks comprised of one or more layers of metal and having a top layer of semiconductor material such as polysilicon or amorphous silicon for example. In the case of gate 120, the metal layer in contact with gate dielectric 122 is chosen to be a metal favorable for N channel transistors. Similarly for gate 132, the metal layer in contact with gate dielectric 134 is chosen to be a metal favorable for P channel transistors. It may alternatively be desirable for metal layers be of the same metal for the N and P channel transistors. Gate dielectrics 122 and 134 may comprise a high K dielectric. Metal oxides, hafnium oxide is such an oxide, are known to be effective for use as high K dielectrics in forming gate dielectrics. Liners 124 and 136 may be deposited oxide. Sidewall spacers 126 and 138 may be deposited nitride. Also liners 124 and 136 and sidewall spacers 126 and 138 may be formed in multiple layers and potentially of other materials. Source/drain regions 128, 130, 140, and 142 are formed by implants using gates 120 and 132 and sidewall spacers 126 and 138 as masks. Resistor 118 is formed by an implant into substrate 112 or alternatively by using a portion of the gate stack materials or an entire stack of gate stack materials. Substrate 12 is oriented so that the channels of semiconductor devices 114 and 116 are in the <100> crystal orientation. The most common orientation has been the <110> orientation but the <100> can be easily obtained by rotating the semiconductor wafer by 45 degrees. The benefits of the <100> orientation have been discussed. One of affects of the <100> orientation is that P channel devices are not adversely affected by applying tensile stress.

Figure 9:
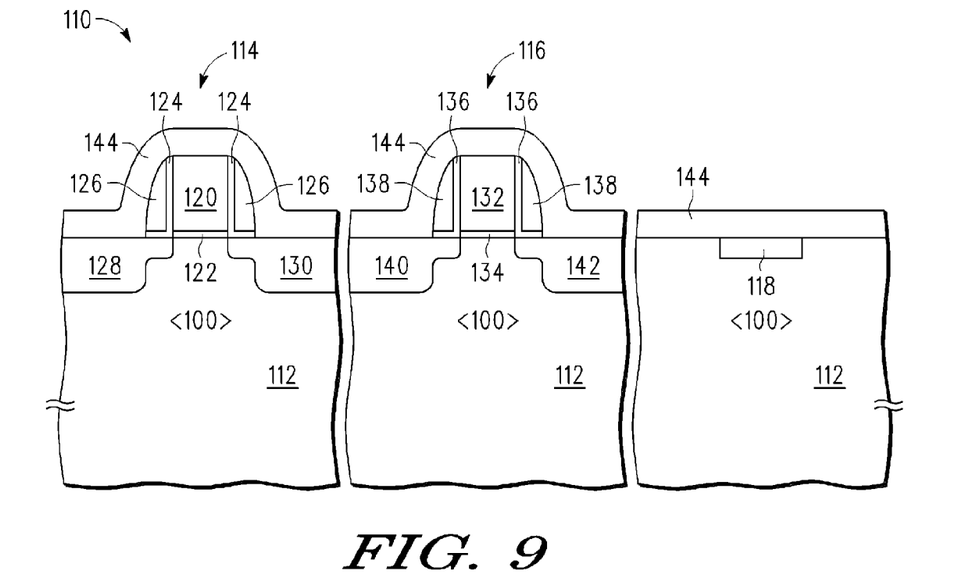
FIG. 9 is a cross section of the semiconductor device of FIG. 8 at subsequent stage in processing.

Shown in FIG. 9 is semiconductor device 110 after depositing an SMT film 144 over devices 114 and 116 and resistor 118. SMT film 144 may include nitride that is deposited by PECVD. SMT film 144 preferably includes a relatively thin oxide layer deposited before the nitride layer. An example may be that the nitride layer is about 500 Angstroms thick and the oxide layer may then be about 100 Angstroms thick.

Figure 10:
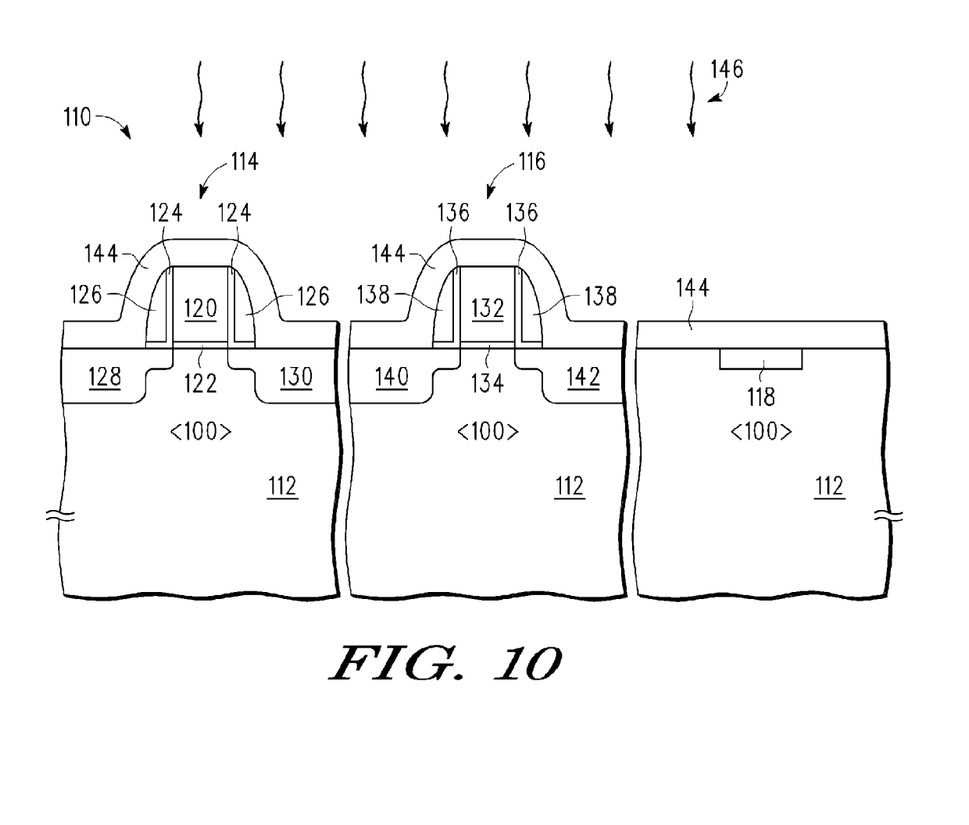
FIG. 10 is a cross section of the semiconductor device of FIG. 9 at subsequent stage in processing.

Shown in FIG. 10 is semiconductor device 110 receiving an anneal 46. In this embodiment, SMT film 144 is not removed over P channel device 116. Anneal 146 causes a transfer of the tensile stress of SMT film 144 to the channel of N channel device 114 in a manner that causes N channel device 114 to retain the stress, or at least much of it, that was transferred during anneal 146. To the extent there is a transfer of stress to P channel device 116, the performance of P channel device 116 is not adversely impacted. As described for semiconductor device 110, this stress transfer by anneal 146 can be achieved with heat applied by a laser for a duration that is very short compared to conventional anneals. A laser anneal can be about a millisecond. Anneal 146 is preferably about 1250 degrees Celsius for about 1 millisecond and preferably less than 10 milliseconds. This is sufficient to provide the stress transfer but not too much to cause oxide growth in the channel. It also, however, is not sufficient to activate the implants of source/drains 128, 130, 140, and 142. Thus, after anneal 146, the needed stress transfer has occurred with minimal additional oxide growth in the channel, but the source/drain dopants have not been activated.

Figure 11:
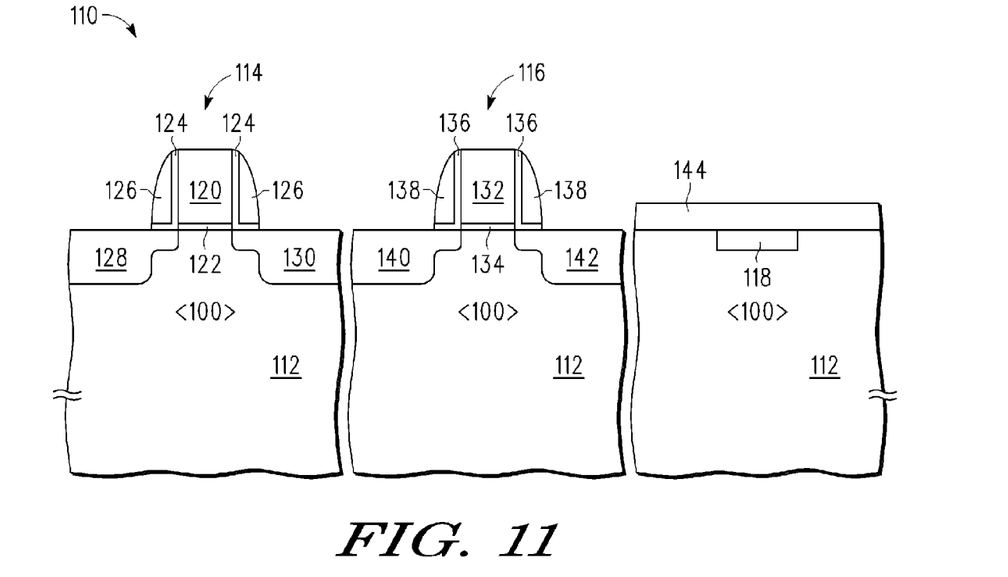
FIG. 11 is a cross section of the semiconductor device of FIG. 10 at subsequent stage in processing.

Shown in FIG. 11 is semiconductor device 110 after SMT film 144 has been removed from over N channel device 114. This includes a masking step because SMT film 144 is preferably retained over resistor 18 to provide mask to a subsequent silicide step.

Figure 12:
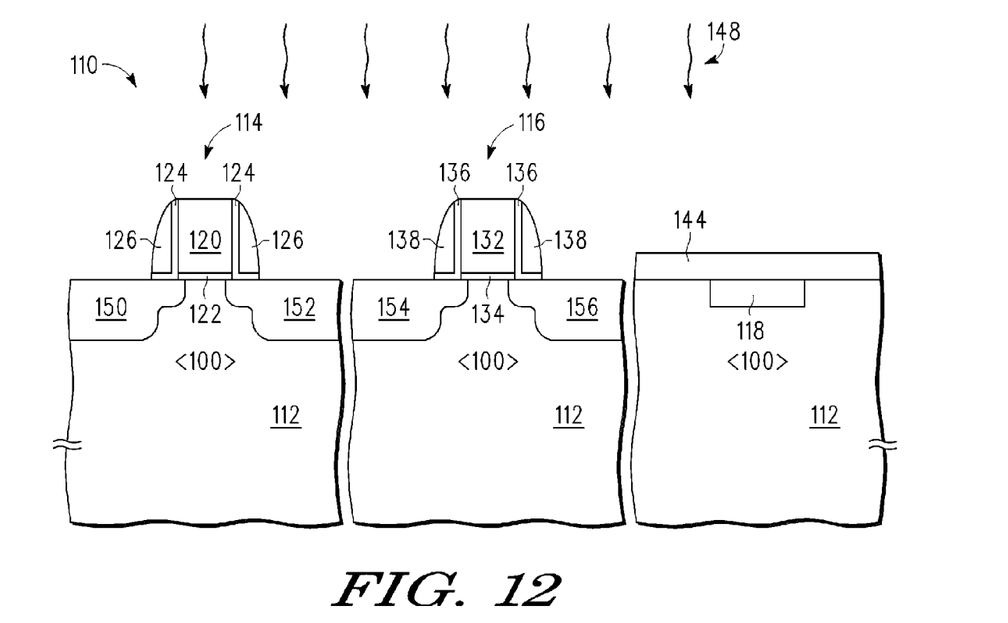
FIG. 12 is a cross section of the semiconductor device of FIG. 11 at subsequent stage in processing.

Shown in FIG. 12 is semiconductor device 110 after performing an anneal 148 that activates the dopants in implanted source/drain regions 128, 130, 140, and 142 to resulting in activated source/drain regions, 150, 152, 154, and 156, respectively. Anneal 148 can be achieved using a conventional lamp RTA type anneal. One example of such an RTA anneal is a spike anneal that includes ramping up the temperature then ramping it down. Anneal 148 has been found to be effective when the anneal chamber temperature is ramped up from room temperature to 1065 degrees Celsius at a rate of 200 degrees Celsius per second and upon attaining 1065 degrees Celsius immediately ramping down to room temperature at a rate of 75 degrees per second. Activating the source/drain implants causes some diffusion of the implanted dopants so that activated source/drain regions 150, 152, 154, and 156 are somewhat larger than their counterpart implanted source/drain regions 128, 130, 140, and 142, respectively.

Figure 13:
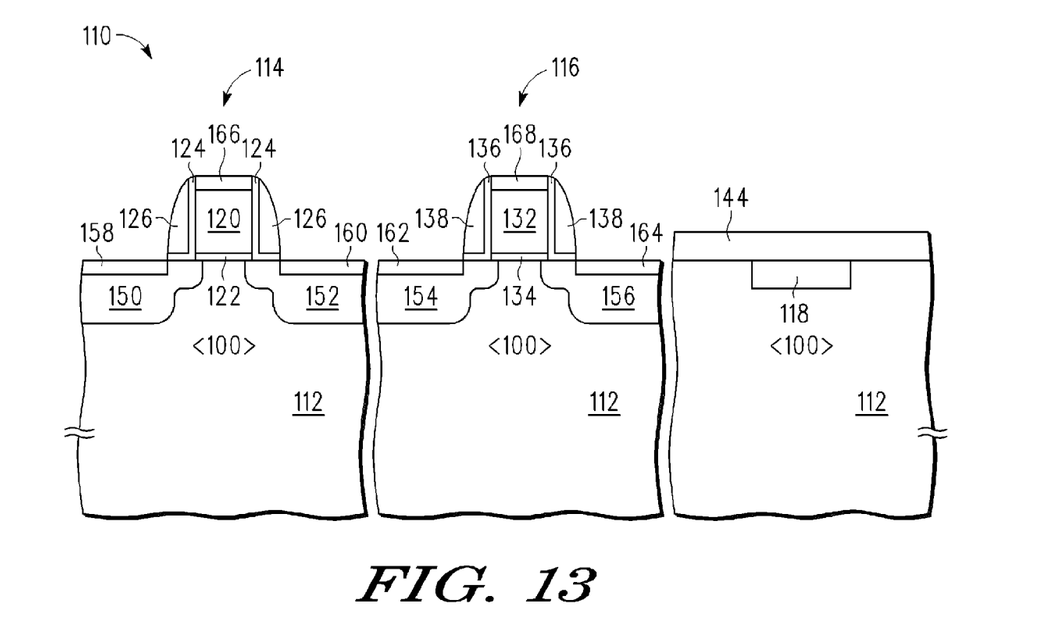
FIG. 13 is a cross section of the semiconductor device of FIG. 12 at subsequent stage in processing.

Shown in FIG. 13 is semiconductor device 110 after forming a silicide region 158 in a top portion of source/drain region 150, a silicide region 60 in a top portion of source/drain region 152, a silicide region 162 in a top portion of source/drain region 154, and a silicide region 164 in a top portion of source/drain region 156. Recalling that gates 120 and 132 are preferably gate stacks that have semiconductor top layers, a silicide region 166 is formed in a top portion of source/drain region 150 in a top portion of source/drain region 150, and a silicide region 168 is formed in a top portion of source/drain region 150. During the silicidation, resistor 118 is protected by SMT film 144 that was not etched way when SMT film was etched away from either of devices 114 or 116.

Thus, for the case in which the N and P channel devices are formed in the <100> orientation, the SMT does not have to be removed prior to performing the short laser anneal or even the spike anneal. This saves a mask step. The protection of the resistor using the SMT film is still retained.

By now it should be appreciated that there has been provided a method of forming a semiconductor device. The method includes providing a semiconductor substrate. The method further includes forming at least an n-channel transistor structure overlying and within the semiconductor substrate, wherein the n-channel transistor structure includes a gate dielectric overlying a channel region within the semiconductor substrate, a gate stack overlying the gate dielectric, a sidewall spacer adjacent a sidewall of the gate stack and overlying a portion of the semiconductor substrate proximate the channel region, and source and drain implant regions within the semiconductor substrate proximate the channel region. The method further includes forming a stress memorization technique (SMT) layer over the n-channel transistor structure. The method further includes transferring a stress from the SMT layer into the channel, wherein transferring the stress excludes any appreciable gate dielectric degradation. The method further includes removing the SMT layer overlying the n-channel transistor structure subsequent to the stress transfer. The method further includes activating dopants of the source and drain implant regions of the n-channel transistor structure. The method may be further characterized by the transferring the stress including performing a first anneal, the first anneal comprising one of a group consisting of a millisecond type anneal, a laser anneal, and a low temperature rapid thermal anneal, wherein low temperature includes a temperature less than on the order of 1035° C. The method may be further characterized by. The method may be further characterized by the first anneal including a laser anneal for annealing at a temperature on the order on 1200-1350 degrees Celsius (1200° C.-1350° C.). The method may be further characterized by the activating dopant of the source and drain implant regions including performing a second anneal. The method may be further characterized by the second anneal including a spike anneal that includes a temperature ramp up from a starting temperature to a peak temperature that is immediately followed by a ramp down from the peak temperature to a final temperature; the ramp up including a ramp up rate on the order of two hundred degrees Celsius per second (200° C./s); and the ramp down including a ramp down rate on the order of seventy-five degrees Celsius per second (75° C./s). The method may be further characterized by the starting temperature comprising on the order of room temperature and the peak temperature comprising on the order of 1065 degrees Celsius (1065° C.), and the SMT layer overlying the n-channel transistor structure experiencing only a first anneal for transferring stress. The method may be further characterized by the SMT layer overlying the n-channel transistor structure experiences only a first anneal for transferring stress. The method may be further characterized by the steps of (i) transferring stress and (ii) activating dopant being decoupled from one another. The method may be further characterized by removal of the SMT layer prior to activating dopant of the source and drain implant regions of the n-channel transistor structure preventing the SMT layer overlying the n-channel transistor structure from being subjected to the second anneal and thereby preventing any gate dielectric degradation which could occur if the SMT layer overlying the n-channel transistor structure is subjected to the second anneal. The method may be further characterized by (i) stress transfer from the SMT layer into the channel of the n-channel transistor structure and (ii) subsequent dopant activation occurring in the absence of gate dielectric degradation, wherein gate dielectric degradation comprises oxide growth in regions of the semiconductor substrate proximate edges of the gate dielectric. The method may be further characterized by siliciding exposed portions of the source and drain regions and the gate stack after the step of activating. The method may be further characterized by the gate dielectric comprising a high-k dielectric and the gate stack including a metal layer overlying the high-k dielectric. The method may be further characterized by the SMT layer including a liner having a thickness on the order of 50-150 angstroms that is formed prior to a remainder of the SMT layer having a thickness on the order of 300-800 angstroms. The method may be further characterized by the SMT layer comprising a plasma enhanced chemical vapor deposition (PECVD) nitride and the liner comprising an oxide. The method may be further characterized by the at least an n-channel transistor structure being formed overlying and within a first portion of the semiconductor substrate, the method may further comprise forming at least a p-channel transistor structure overlying and within a second portion of the semiconductor substrate, wherein the p-channel transistor structure includes a gate dielectric overlying a second channel region within the semiconductor substrate, a gate stack overlying the gate dielectric, a sidewall spacer adjacent a sidewall of the gate stack and overlying a portion of the semiconductor substrate proximate a second channel region, and source and drain implant regions within the semiconductor substrate proximate the second channel region; and forming a resistor within a third portion of the semiconductor substrate. The method may be further characterized by. The method may be further characterized by wherein forming the SMT layer further includes forming the SMT layer over the n-channel transistor structure, the p-channel transistor structure, and the resistor. The method may be further characterized by prior to transferring stress from the SMT layer into the channel of the n-channel transistor structure, the method may further comprise: removing the SMT layer overlying the p-channel transistor structure, wherein a portion of the SMT layer overlies the n-channel transistor structure and the resistor remains, wherein subsequent to transferring stress from the SMT layer into the channel region of the n-channel transistor structure, the step of removing the SMT layer further includes removing the SMT layer overlying the n-channel transistor structure alone, wherein a portion of the SMT layer overlying the resistor remains, and wherein the step of activating dopants further includes activating dopant of the respective source and drain implant regions of the n-channel transistor structure and the p-channel transistor structure. The method may be further characterized by siliciding exposed portions of the source and drain regions and the gate stack of the n-channel transistor structure and the p-channel transistor structure after the step of activating, wherein the SMT layer overlying the resistor in the third region of the semiconductor substrate inhibits formation of silicide on the resistor and the semiconductor substrate in the third region. The method may be further characterized by the substrate includes a <100> channel orientation substrate, the removing the SMT layer further including removing the SMT layer overlying the n-channel transistor structure and the p-channel transistor structure subsequent to the stress transfer, wherein a portion of the SMT layer overlying the resistor remains, and the step of activating dopants further including activating dopant of the respective source and drain implant regions of the n-channel transistor structure and the p-channel transistor structure.

Also described is a semiconductor device in which at least an n-channel transistor structure overlies and is within a semiconductor substrate. The n-channel transistor structure includes a gate dielectric overlying a channel region within the semiconductor substrate, a gate stack overlying the gate dielectric, a sidewall spacer adjacent a sidewall of the gate stack and overlying a portion of the semiconductor substrate proximate the channel region, and source and drain regions within the semiconductor substrate proximate the channel region. The gate dielectric comprises a high-k dielectric. The gate stack includes a metal layer overlying the high-k dielectric. The n-channel transistor structure is devoid of gate dielectric degradation. Gate dielectric degradation comprises deleterious oxide growth in regions of the semiconductor substrate proximate edges of the gate dielectric.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, particular metals for use in the gate stacks may be chosen than simply for optimizing the electrical operation. The short anneal that transferred the stress was described as a laser anneal but another anneal that can be sufficiently quick to achieve the stress transfer without causing the deleterious oxide growth at the border of the channel may be usable. The source/drain implantation was described as being done before SMT film deposition, but source/drain implantation could be done after SMT film removal. Also, the stressor film over the resistor was retained as being beneficial for providing a convenient block to silicidation, but the stressor could be removed prior to the first anneal or the second anneal concurrent with the removal of the SMT film overlying the PFET region, and another technique be used to prevent silicidation of the resistor. Another possibility is that an alternative to silicidation is found so that the stressor layer over the resistor is not needed for that reason. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a semiconductor device comprising:

providing a semiconductor substrate;

forming an n-channel transistor structure overlying and within the semiconductor substrate, wherein the n-channel transistor structure includes a gate dielectric overlying a channel region within the semiconductor substrate, a gate stack overlying the gate dielectric, a sidewall spacer adjacent a sidewall of the gate stack and overlying a portion of the semiconductor substrate proximate the channel region, and source and drain implant regions within the semiconductor substrate proximate the channel region;

forming a p-channel structure overlying and within the semiconductor substrate, wherein the p-channel transistor structure includes a gate dielectric overlying a channel region within the semiconductor substrate, a gate stack overlying the gate dielectric, a sidewall spacer adjacent a sidewall of the gate stack of the p-channel transistor structure and overlying a portion of the semiconductor substrate proximate the channel region of the p-channel transistor structure, and source and drain implant regions within the semiconductor substrate proximate the channel region of the p-channel transistor structure;

forming a stress memorization technique (SMT) layer over the n-channel transistor structure and the p channel structure;

removing the SMT layer from over the p-channel transistor structure and leaving the SMT layer over the n-channel transistor structure;

transferring a stress from the SMT layer into the channel of the n-channel transistor structure, wherein transferring the stress excludes any appreciable gate dielectric degradation;

removing the SMT layer overlying the n-channel transistor structure subsequent to the stress transfer; and activating dopants of the source and drain implant regions of the n-channel transistor structure after removing the SMT layer overlying the n-channel transistor structure.

2. The method of claim 1, wherein transferring the stress includes performing a first anneal, the first anneal comprising one of a group consisting of a millisecond type anneal, a laser anneal, and a low temperature rapid thermal anneal, wherein low temperature includes a temperature less than on the order of 1035° C.

3. The method of claim 2, wherein the first anneal includes a laser anneal for annealing at a temperature on the order on 1200-1350 degrees Celsius (1200° C.-1350° C.).

4. The method of claim 1, wherein activating dopant of the source and drain implant regions includes performing a second anneal.

5. The method of claim 4, wherein:
the second anneal includes a spike anneal that includes a temperature ramp up from a starting temperature to a peak temperature that is immediately followed by a ramp down from the peak temperature to a final temperature;
the ramp up includes a ramp up rate on the order of two hundred degrees Celsius per second (200° C./s); and
the ramp down includes a ramp down rate on the order of seventy-five degrees Celsius per second (75° C./s).

6. The method of claim 5, wherein the starting temperature comprises on the order of room temperature and the peak temperature comprises on the order of 1065 degrees Celsius (1065° C.).

7. The method of claim 1, wherein the steps of (i) transferring stress and (ii) activating dopant are decoupled from one another.

8. The method of claim 1, wherein the SMT layer overlying the n-channel transistor structure experiences only a first anneal for transferring stress.

9. The method of claim 8, wherein removal of the SMT layer prior to activating dopant of the source and drain implant regions of the n-channel transistor structure prevents the SMT layer overlying the n-channel transistor structure from being subjected to the second anneal and thereby prevents any gate dielectric degradation which could occur if the SMT layer overlying the n-channel transistor structure is subjected to the second anneal.

10. The method of claim 1, wherein (i) stress transfer from the SMT layer into the channel of the n-channel transistor structure and (ii) subsequent dopant activation occur in the absence of gate dielectric degradation, wherein gate dielectric degradation comprises oxide growth in regions of the semiconductor substrate proximate edges of the gate dielectric.

11. The method of claim 1, further comprising:
siliciding exposed portions of the source and drain regions and the gate stack after the step of activating.

12. The method of claim 1, wherein the gate dielectric comprises a high-k dielectric, and wherein the gate stack includes a metal layer overlying the high-k dielectric.

13. The method of claim 1, wherein the SMT layer includes a liner having a thickness on the order of 50-150 angstroms that is formed prior to a remainder of the SMT layer having a thickness on the order of 300-800 angstroms.

14. The method of claim 13, wherein the SMT layer comprises a plasma enhanced chemical vapor deposition (PECVD) nitride and the liner comprises an oxide.

15. The method of claim 1, further comprising:
forming a resistor within a third portion of the semiconductor substrate,
wherein:
forming the SMT layer further includes forming the SMT layer over the n-channel transistor structure, the p-channel transistor structure, and the resistor;
the steps of removing the SMT layer are characterized as leaving the SMT layer over the resistor; and
siliciding the sources and drains of the p-channel and n-channel transistor structures while the SMT layer is over the resistor so that the SMT layer prevents silicidinq the resistor.

* * * * *